United States Patent
Kim et al.

(10) Patent No.: US 8,724,414 B2
(45) Date of Patent: May 13, 2014

(54) SYSTEM AND METHOD TO SELECT A REFERENCE CELL

(75) Inventors: Jung Pill Kim, San Diego, CA (US);
Tae Hyun Kim, San Diego, CA (US);
Hari M. Rao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 355 days.

(21) Appl. No.: 12/702,486

(22) Filed: Feb. 9, 2010

(65) Prior Publication Data
US 2011/0194333 A1  Aug. 11, 2011

(51) Int. Cl.
| | |
|---|---|
| *G11C 7/02* | (2006.01) |
| *G11C 7/14* | (2006.01) |
| *G11C 29/00* | (2006.01) |
| *G11C 8/12* | (2006.01) |

(52) U.S. Cl.
CPC ............... *G11C 7/14* (2013.01); *G11C 29/808* (2013.01); *G11C 8/12* (2013.01)
USPC ................... 365/210.1; 365/200; 365/230.03; 365/189.09

(58) Field of Classification Search
USPC ............. 365/200, 201, 210.1, 230.03, 189.09
See application file for complete search history.

(56) References Cited

U.S. PATENT DOCUMENTS

| | | | | |
|---|---|---|---|---|
| 5,844,832 A * | 12/1998 | Kim | ............................... | 365/145 |
| 6,438,053 B1 * | 8/2002 | Pochmuller | .............. | 365/210.12 |
| 6,563,743 B2 * | 5/2003 | Hanzawa et al. | ........ | 365/189.02 |
| 7,177,217 B2 | 2/2007 | Martines et al. | | |
| 7,319,628 B2 * | 1/2008 | Sugawara | ................... | 365/210.1 |
| 7,836,364 B1 * | 11/2010 | Sutardja et al. | ............... | 714/723 |
| 2004/0165419 A1 | 8/2004 | Tsuji | | |
| 2005/0044514 A1 * | 2/2005 | Wu et al. | ............................ | 716/5 |
| 2005/0047248 A1 * | 3/2005 | Kim et al. | ...................... | 365/222 |
| 2005/0219920 A1 | 10/2005 | Sugawara | | |
| 2008/0266990 A1 | 10/2008 | Loeffler | | |
| 2009/0201717 A1 | 8/2009 | Maeda et al. | | |

FOREIGN PATENT DOCUMENTS

| | | |
|---|---|---|
| JP | 2005285281 A | 10/2005 |
| JP | 2007250185 A | 9/2007 |
| JP | 2009187631 A | 8/2009 |

OTHER PUBLICATIONS

U.S. Appl. No. 13/778,173.*
International Search Report and Written Opinion—PCT/US2011/024050, International Search Authority—European Patent Office—Apr. 5, 2011.

* cited by examiner

*Primary Examiner* — Kretelia Graham
(74) *Attorney, Agent, or Firm* — Sam Talpalatsky; Nicholas J. Pauley; Joseph Agusta

(57) ABSTRACT

A system and method to select a reference cell is disclosed. In a particular embodiment, a method is disclosed that includes receiving an address corresponding to a bit cell within a first bank of a memory. The method also includes accessing a second reference cell of a second bank of the memory in response to a first reference cell in the first bank being indicated as bypassed.

43 Claims, 8 Drawing Sheets

_US 8,724,414 B2_

SYSTEM AND METHOD TO SELECT A REFERENCE CELL

I. FIELD

The present disclosure is generally related to selecting reference cells.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing and data storage capabilities.

For example, a portable personal computing device can include a memory that uses a comparison to one or more reference cells to determine a data value of a bit cell. A sense amplifier may compare an output of a bit cell accessible via a word line with an output of a reference cell accessible via the word line. If the reference cell accessible via the word line of the bit cell fails, the sense amplifier may not have a reference to use for determining the data value of the bit cell.

III. SUMMARY

A memory is disclosed that enables a data value of a bit cell at one bank of the memory to be determined based on a reference cell at another bank of the memory. For example, when a reference cell in a same bank as the bit cell is indicated as bypassed, the memory may determine the data value of the bit cell from a reference cell at another bank of the memory.

In a particular embodiment, a method is disclosed that includes receiving an address corresponding to a bit cell within a first bank of a memory. The method also includes accessing a second reference cell of a second bank of the memory in response to a first reference cell in the first bank being indicated as bypassed.

In another particular embodiment, an apparatus is disclosed that includes a memory. The memory includes a first bank that includes a first bit cell and a first reference cell. The memory also includes a second bank comprising a second bit cell and a second reference cell. The memory includes reference selection circuitry configured to access the second reference cell during a read operation of the first bit cell in response to receiving a bypass signal indicating the first reference cell as bypassed.

One particular advantage provided by at least one of the disclosed embodiments is an ability of a memory to continue to determine data values of a bit cell when a reference cell on a corresponding word line fails by selecting another reference cell from another word line.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
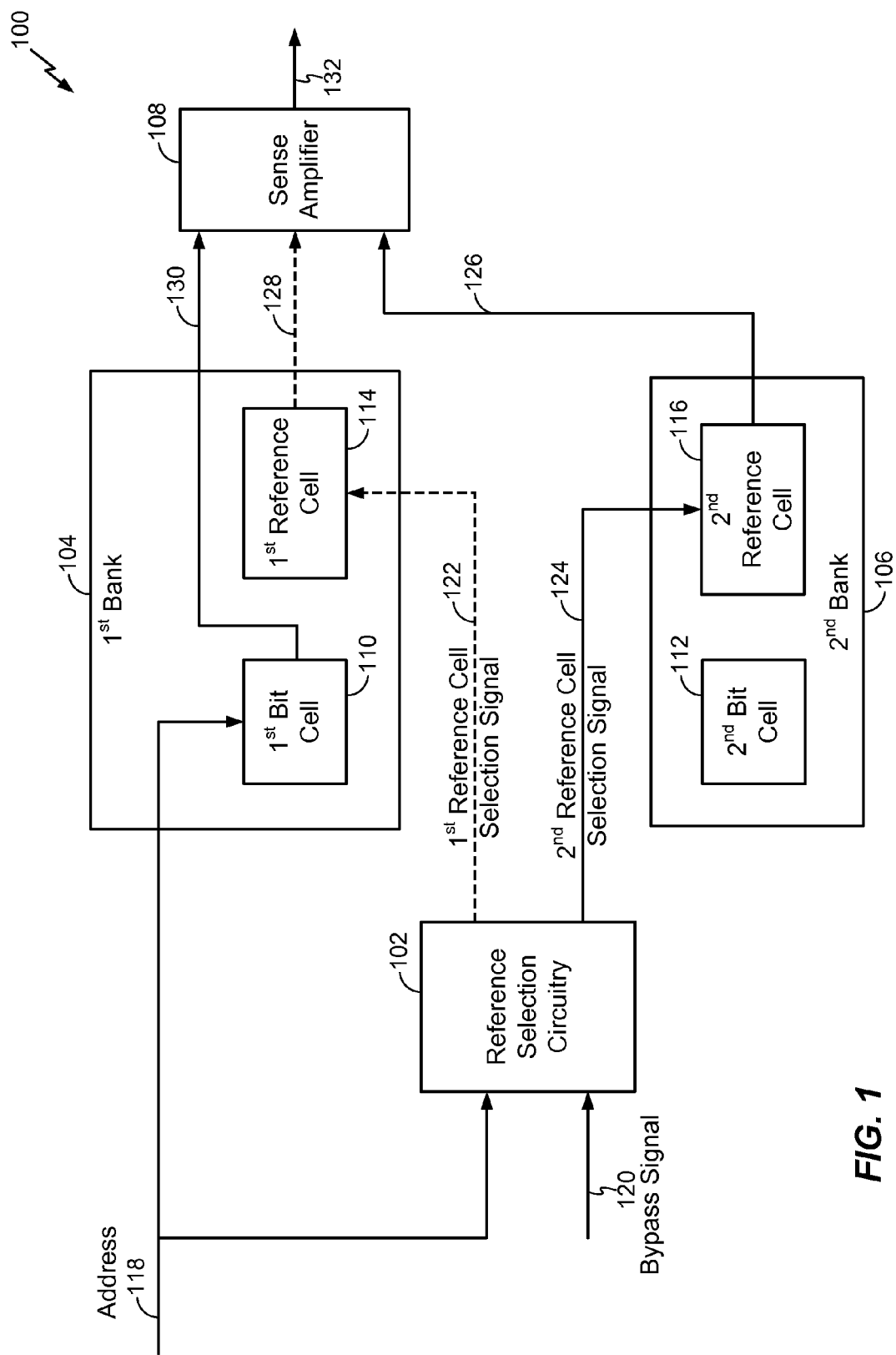
FIG. 1 is a block diagram of a particular illustrative embodiment of a memory including reference selection circuitry.

Referring to FIG. 1, a first embodiment of a memory including reference selection circuitry 102 is depicted and generally designated 100. The memory 100 includes the reference selection circuitry 102, a first bank 104, a second bank 106, and a sense amplifier 108 coupled to the first bank 104 and to the second bank 106. The first bank 104 includes multiple cells, such as a first representative bit cell 110 and a first representative reference cell 114. The second bank 106 includes multiple cells, such as a second representative bit cell 112 and a second representative reference cell 116. The reference selection circuitry 102 is configured to selectively bypass reference cells of one bank 104 or 106 and to access reference cells of the other bank 104 or 106 in response to a bypass signal 120. As a result, the yield and lifespan of the memory 100 may be increased through the use of redundant reference cells in the event of a cell failure in a particular bank 104, 106.

Figure 3:
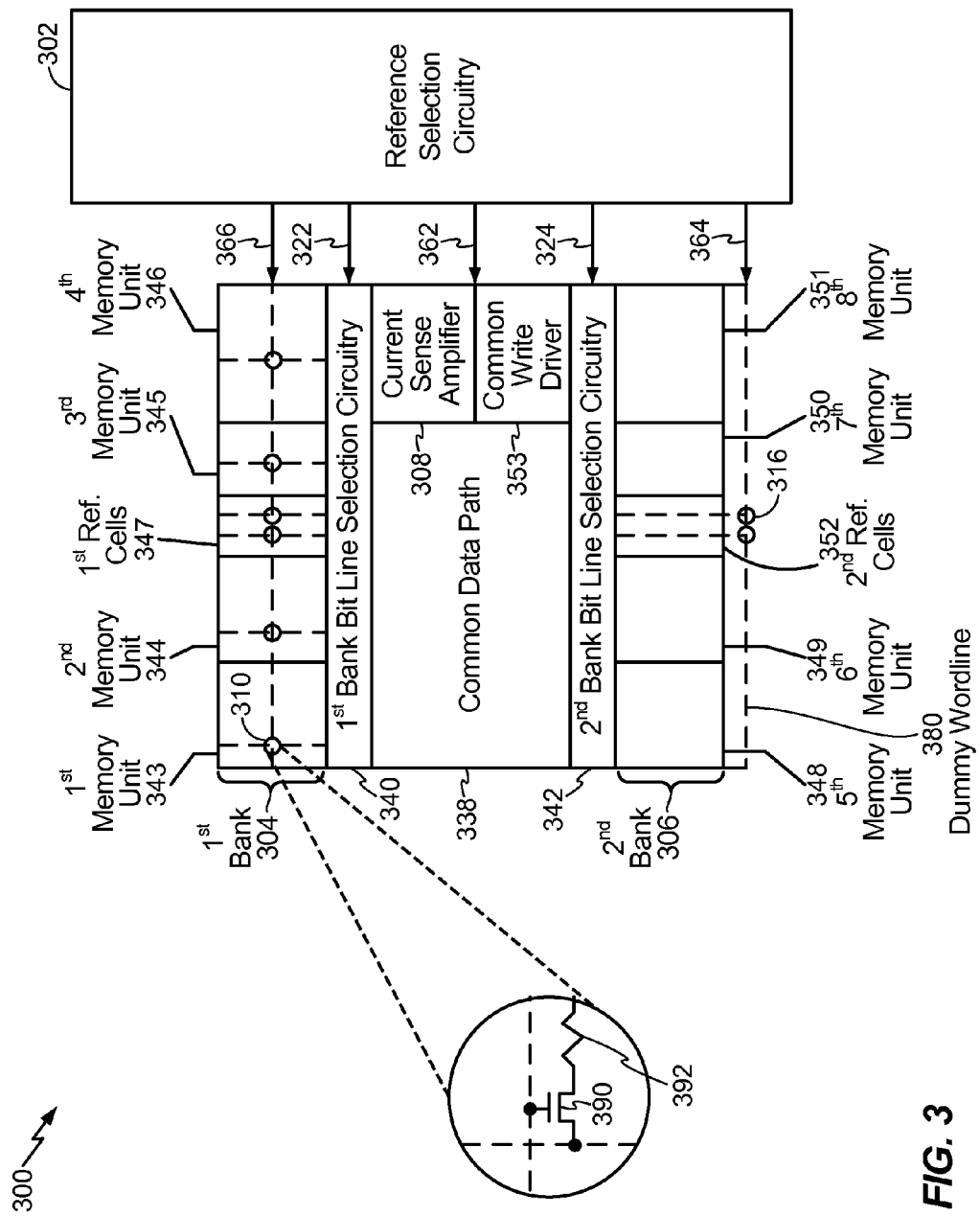
FIG. 3 is a block diagram of a third illustrative embodiment of a memory including reference selection circuitry.

In a particular embodiment, the first bank 104 includes a first plurality of bit cells, including the first representative bit cell 110. For example, the memory 100 may be a resistance-based memory device, such as a magneto-resistive random access memory (MRAM) or a spin-torque transfer MRAM (STT-MRAM) and the first bank 104 may be a bank of a MRAM. The first representative bit cell 110 may include a magnetic tunnel junction (MTJ) element serially coupled to an access transistor, as shown in FIG. 3. The first bank 104 may also includes multiple reference cells. In a particular embodiment, the first representative reference cell 114 includes a MTJ element that stores a first logic value and that is accessible via an access transistor. For example, the first representative reference cell 114 may store a logical one value and may be accessed in combination with a second reference cell (not shown) of the first bank 104 having a logical zero value, such that the combination of the logical one and the logical zero values may be compared to the value of the first bit cell 110 to determine an output at the sense amplifier 108.

In a particular embodiment, the second bank 106 is a MRAM memory bank including a plurality of MRAM cells. For example, the second bit cell 112 may be an MRAM cell including a MTJ element to store a data value and an access transistor to enable access to the second bit cell 112. The second representative reference cell 116 may include an MTJ element storing a fixed data value, such as a logical zero or a logical one value, and an access transistor to enable the stored data value to be provided to the sense amplifier 108.

In a particular embodiment, the sense amplifier 108 is configured to receive an output 130 from the first bit cell 110 and to compare the output 130 to an output from a reference cell. For example, the output 130 from the first bit cell 110 may be compared to an output 128 from the first reference cell 114 or to an output 126 from the second reference cell 116. The sense amplifier 108 may include a two-stage sense amplifier that includes a current sense amplifier and a voltage sense amplifier. For example, a differential voltage may be generated based on a comparison of the currents at the first output 130 and the reference output 126 or 128. The differential voltage may be provided to a voltage amplifier to generate an output 132 of the sense amplifier 108.

In a particular embodiment, the first bit cell 110 of the first bank 108 is addressable via an address 118 that is received at the memory 100. In addition, the first reference cell 114 may also be selectable via the address 118. To illustrate, the address 118 may correspond to a word line that is coupled to the first bit cell 110 and to the first reference cell 114. The address 118 may also be provided to the reference selection circuitry 102.

In a particular embodiment, the reference selection circuitry 102 is configured to receive the address 118 and is also configured to receive a bypass signal 120. The reference selection circuitry 102 may be configured to access the second reference cell 116 during a read operation of the first bit cell 110 in response to receiving the bypass signal 120 indicating the first reference cell 114 as bypassed. For example, when the reference cell 114 has been determined to be inoperable, marginally operable, or otherwise determined to be undesirable for operation, the bypass signal 120 may be provided in conjunction with the address 118. The reference selection circuitry 102 may respond to the bypass signal 120 by deselecting a first reference cell selection signal 122 and instead selecting a second reference cell selection signal 124. The second reference cell selection signal 124 may operatively couple the second reference cell 116 to the sense amplifier 108 via the output 126. A data value stored at the first bit cell 110 may be determined by comparison to a reference value provided by the second reference cell 116. As a result, an error in the first reference cell 114 may not impede operation of the memory 100 because the reference selection circuitry 102 enables use of reference cells at the second bank 106 as redundant reference cells for read operations at the first bank 104.

During operation, a data value may be read from the memory 100 in response to receiving the address 118 indicating the first bit cell 110 in the first bank 104. The reference selection circuitry 102 may not receive the bypass signal 120 and may provide the first reference cell selection signal 122 to enable an operative coupling of the first reference cell 114 to the sense amplifier 108 via the output 128. The output 130 of the first bit cell 110 and the output 128 of the first reference cell 114 may be provided to the sense amplifier 108, and the output 132 of the sense amplifier 108 may represent the data value stored at the first bit cell 110 as determined based on the first reference cell 114.

After determining that the first reference cell 114 is non-operational, or otherwise is to be bypassed during data reads, when a second receipt of the address 118 at the memory 100, the bypass signal 120 may also be received at the reference selection circuitry 102. In response to receiving the bypass signal 120 at the reference selection circuitry 102, the second reference cell signal 124 may be provided to the second reference cell 116 and the output 126 of the second reference cell 116 may be provided to the sense amplifier 108. As a result, the data value stored at the first bit cell 110 may be compared to the reference cell 116 at the sense amplifier 108 to generate an output 132 representing the data value stored at the first bit cell 110 as determined based on the second reference cell 116. By enabling the memory 100 to determine a data value of a bit cell 110 in the first bank 104 based on a reference cell in the first bank 104 or based on a reference cell in the second bank 106 when a reference cell (e.g., the first reference cell 114) in the first bank 104 is undesirable as a reference, the memory 100 may continue using the bit cell 110 despite a reference cell failure, thus potentially expanding a yield and a lifespan of the memory 100.

Figure 2:
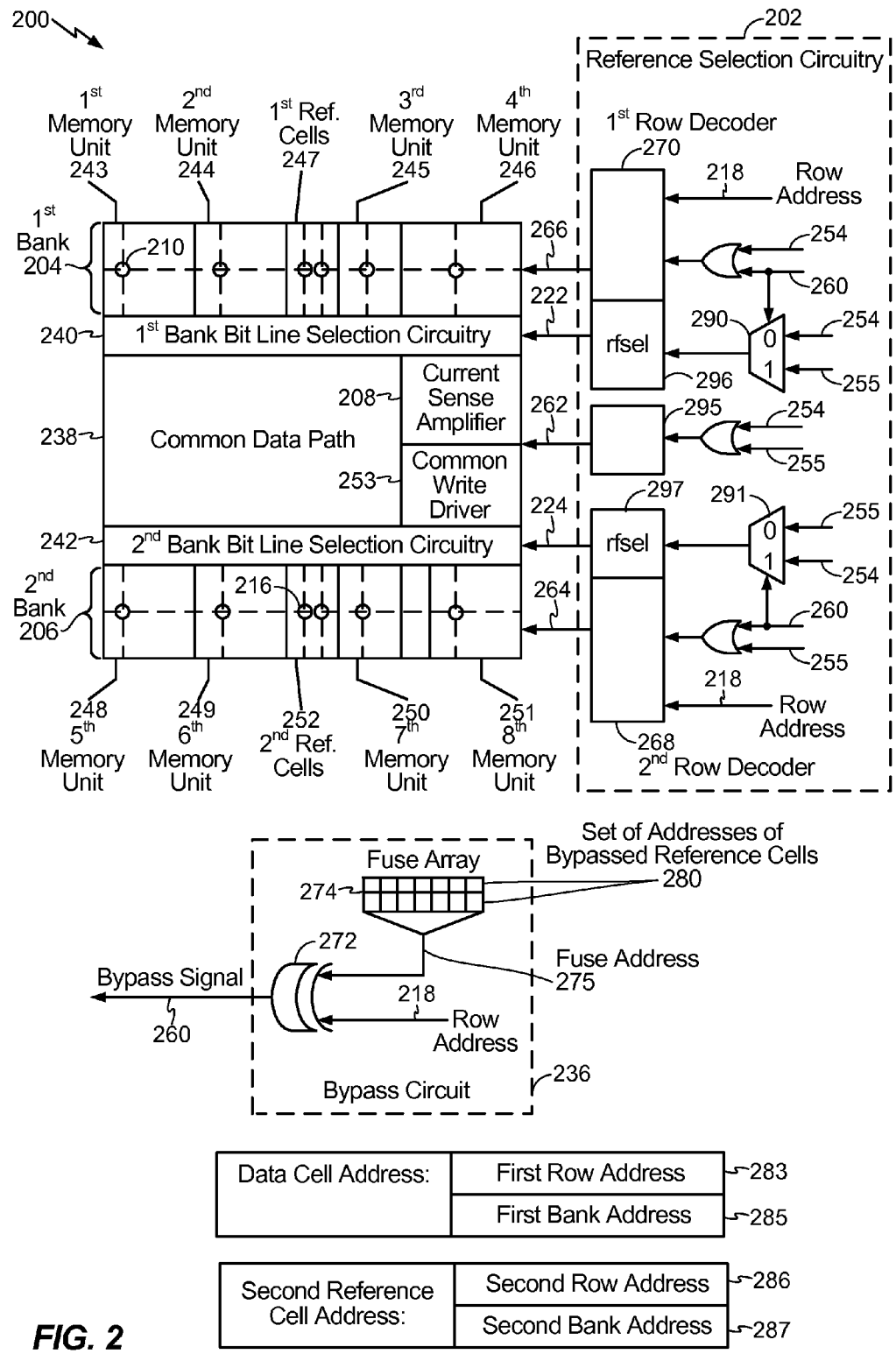
FIG. 2 is a block diagram of a second illustrative embodiment of a memory including reference selection circuitry.

Referring to FIG. 2, a memory including reference selection circuitry 202 is depicted and generally designated 200. The memory 200 includes the reference selection circuitry 202 coupled to a first bank 204 and a second bank 206 of memory. The memory 200 also includes a bypass circuit 236 configured to provide a bypass signal 260 to the reference selection circuitry 202. The memory 200 enables a read operation to occur at a selected one of the first bank 204 and the second bank 206 by bypassing a reference cell of the selected bank and instead using a reference cell of the other of the first bank 204 and the second bank 206. In an illustrative embodiment, the memory 200 corresponds to the memory 100 of FIG. 1.

In a particular embodiment, the first bank 204 includes a first memory unit 243, a second memory unit 244, a third memory unit 245 and a fourth memory unit 246. Each of the memory units 243-246 may include multiple memory cells arranged according to multiple word lines, illustrated as a horizontal dash line, and multiple bit lines, illustrated as a vertical dash line. For example, the first memory unit 243 may be arranged as an array that includes five hundred and twelve rows of memory cells arranged horizontally and eight columns of the memory cells arranged vertically. The first memory unit 243 may be referred to as an input/output (I/O) and may be accessible by the reference selection circuitry 202. Each of the second memory unit 244, the third memory unit 245, and the fourth memory unit 246 may be arranged in a substantially similar manner as the first memory unit 243.

The first bank 204 includes first reference cells 247. The first reference cells 247 may include multiple memory cells arranged in an array of columns and rows. For example, the first reference cells 247 may include two columns of memory cells arranged in five hundred and twelve rows. For example, one of the columns of the first reference cells 247 may include memory cells that all store a logical zero value, and the other column of the first reference cells 247 may include memory cells that all store a logical one value.

In a particular embodiment, first bank bit line selection circuitry 240 is coupled to the memory units 243-246 and to the first reference cells 247. The first bank bit line selection circuitry 240 may be configured to select one of the bit lines based on a multi-bit input signal, and to select a same bit line in each of the memory units 243-246. For example, where each memory unit 243-246 includes eight bit lines, the first bank bit line selection circuitry 240 may be responsive to a three bit input signal to select a single bit line of each of the memory units 243-246.

In a particular embodiment, the second bank 206 includes a fifth memory unit 248, a sixth memory unit 249, a seventh memory unit 250, and an eighth memory unit 251. The second bank 206 also includes second reference cells 252. In a particular embodiment, the memory units 248-251 of the second bank 206 are substantially similar to the memory units 243-246 of the first bank 204, and the second reference cells 252 are substantially similar to the first reference cells 247. The memory units 248-251 of the second bank 206 are coupled to second bank bit line selection circuitry 242. The second bank bit line selection circuitry 242 may operate in a substantially similar manner as the first bank bit line selection circuitry 240.

In a particular embodiment, the first bank 204 and the second bank 206 are each coupled to a common data path 238. For example, the common data path 238 may include a current sense amplifier 208 and a common write driver 253 that are each used during a memory access to the fourth memory unit 246 or the eighth memory unit 251. In a particular embodiment, the current sense amplifier 208 behaves in a substantially similar way as described with respect to the sense amplifier 108 of FIG. 1. For example, the current sense amplifier 208 may provide a differential voltage signal to a voltage amplifier (not shown). In a particular embodiment, the common write driver 253 is configured to enable write operations to a selected memory cell of a selected memory unit at a selected bank. Although only a single current sense amplifier 208 and common write driver 253 are illustrated in FIG. 2, the common data path 238 may include multiple current sense amplifiers, multiple common write drivers, or any combination thereof.

In a particular embodiment, the reference selection circuitry 202 includes a first row decoder 270, a first selection circuit (rfsel) 296, a second row decoder 268, a second selection circuit (rfsel) 297, and a bank selector 295 that is configured to provide a bank selection signal 262. The first row decoder 270 may be configured to receive an input address (e.g., a row address 218) and an output of a logical OR of a first bank signal 254 with a bypass signal 260. The first row decoder 270 may be configured to provide a word line selection signal 266 to select a particular word line of the memory units 243-246. The first selection circuit 296 may be responsive to an output of a first multiplexer 290. The first multiplexer 290 may be responsive to a first bank signal 254 as a first input and a second bank signal 255 as a second input. The bypass signal 260 may be provided as a control signal to the first multiplexer 290 such that when the bypass signal 260 has a zero value, the first bank signal 254 is provided to the first selection circuit 296. When the bypass signal 260 has a one value, the second bank signal 255 may be provided as the input to the first selection circuit 296. The first selection circuit 296 may provide a first selection signal 222 to the first bank bit line selection circuitry 240. In a particular embodiment, the first selection signal 222 indicates a bit line corresponding to the row address 218. The row address 218 may include a first row address and a first bank address.

The second row decoder 268 may be configured to receive the row address 218 and an output of a logical OR of the second bank signal 255 and the bypass signal 260. The second row decoder 268 may also be configured to provide a second word line selection signal 264 to the second bank 206. The second selection circuit 297 may be responsive to an output of a second multiplexer 291. The second multiplexer 291 includes a first input to receive the second bank signal 255 and a second input to receive the first bank signal 254. The second multiplexer 291 may be controlled by the bypass signal 260 such that when the bypass signal 260 has a logical zero value, the second bank signal 255 is provided to the second selection circuit 297, and when the bypass signal 260 has a logical one value, the first bank signal 254 is provided to the second selection circuit 297. The second selection circuit 297 may be configured to provide a second selection signal 224 to the second bank bit line selection circuitry 242. The bank selector 295 of the reference selection circuitry 202 may be responsive to a logical OR operation of the first bank signal 254 and the second bank signal 255 to produce a bank selector signal 262. The bank selector signal 262 may be provided to the common data path 238, such as to enable reads via a sense amplifier such as the current sense amplifier 208 or writes via a write driver such as the common write driver 253.

In a particular embodiment, the bypass circuit 236 includes a fuse array 274 that may store multiple addresses, such as a set of addresses 280 of bypassed reference cells. The fuse array 274 is illustrated as providing a fuse address 275 that is compared to the row address 218 via a comparison logic circuit 272 to generate the bypass signal 260. For example, the comparison logic circuit 272 is illustrated as a logical exclusive-or (XOR) gate to perform a bit-wise comparison of each element of the fuse address 275 with the corresponding elements of the row address 218 to determine whether the fuse address 275 equals the row address 218, or selected portions of the fuse address 275 equals the corresponding selected portions of the row address 218. In response to a match of the selected portions of the fuse address 275 and the corresponding selected portions of the row address 218, the bypass signal 260 may be asserted to a logical one value, and in response to a non-match, the bypass signal 260 may be set to a logical zero value. In a particular embodiment, the fuse array 274 includes an array of multiple fuses, such as an electrically programmable fuse.

During operation, a data value may be desired to be read from a particular bit cell, such as a representative bit cell 210 at the first memory unit 243. The reference selection circuitry 202 and the bypass circuit 236 may determine the bit cell 210 based on the row address 218. Cells of the memory 200 may be indexed by row addresses and bank address. For example, the bit cell 210 may be indicated by a first row address 283 and a first bank address 285 and a second reference cell 216 in the second bank 206 may be indicated by the first row address 283 and a second bank address 287. Alternatively, the second reference cell 216 may be indicated by a second row address 286 and the second bank address 287. In a particular embodiment, the second row address 286 is determined based on the first row address 283.

The first bank 204 and the second bank 206 may share row addresses. For example, a first plurality of word lines of the first bank 204 and a second plurality of word lines of the second bank 206 may share common row addresses. In a particular embodiment, the first plurality of word lines and the second plurality of word lines are non-adjacent (e.g., they are separated by circuitry of the common data path 238).

To access the bit cell 210, the first bank selection signal 254 may be asserted to a logical one value and the second bank selection signal 255 may be set to a logical zero value, indicating that the first bank 204 and not the second bank 206 is selected. The row address 218 may be set to a value to cause the first row decoder 270 to generate the word line selection signal 266 indicating the dashed word line to which the bit cell 210 is coupled. In addition, the first selection circuit 296 may generate a control signal (e.g., the first selection signal 222) to the first bank line selection circuitry 240 indicating that a particular bit line coupled to the bit cell 210 is selected, illustrated as the dashed column coupled to the bit cell 210. Due to common architectures and signaling within the first bank 204, corresponding cells in the memory units 244-246 may also be selected in response to the first selection circuit 296. When the reference cells within the first reference cells 247 corresponding to the selected word line, illustrated as circled reference cells within the first reference cells 247, are operative and indicated as not bypassed, a data read operation may be performed using the first reference cells 247 of the first bank 204. A current sense amplifier, such as the current sense amplifier 208, may receive signals from the bit cell 210 and the reference cells of the first bank 204 and provide an output to a voltage sense amplifier (not shown).

In addition, the bank selector 295 of the reference selection circuitry 202 may receive a logical one value due to the logical OR of the first bank signal 254 and the second bank signal 255 and may generate the bank selection signal 262, such as the logical zero value indicating the first bank 204. The bank selection signal 262 may be used at the common data path 238 to select the first bank 204 to receive values for the read operation. The row address 218 may be provided to the bypass circuit 236 to be compared to the set of addresses 280 of bypassed reference cells by the comparison logic circuit 272. Because the reference cells corresponding to the row address 218 are not indicated as bypassed, the bypass signal 260 output by the comparison logic circuit 272 may have a logical zero value, indicating normal (e.g., non-bypass condition) operation at the memory.

However, when the reference cells corresponding to the selected word line of the first bank 204 are indicated as bypassed, the bypass circuit 236 may generate a logical one value of the bypass signal 260 corresponding to a match of the selected portions of the row address 218 with the fuse address 275. For example, the entire row address 218 may be bit-wise compared to match to an address stored at the fuse array 274. As another example, a most significant section of the row address 218, or another section of the row address 218 that may be sufficient to designate the first bank 204 and the word line and bit line of the cell 210 may be matched to a corresponding portion of an address at the fuse array 274 to generate a logical one at the bypass signal 260.

In response to the logical one of the bypass signal 260, the first row decoder 270 may generate the word line selection signal 266, but through operation of the multiplexer 290, the second bank selection signal 255 may be provided to the first selection circuit 296. Because the first bank 204 remains selected, the second bank signal 255 has a logical zero value, and therefore the first selection signal 222 may have a logical zero value, indicating that the first reference cells 247 of the first bank 204 are not selected for the read of the bit cell 210. Instead, the bypass signal 260 having a logical one value may result in the second row decoder 268 operating to provide the second row selection signal 264 to the second bank 206.

In a particular embodiment, the second row selection signal 264 corresponds to the same word line as the first row selection signal 266. The bypass signal 260 having the one value at the second row decoder 268 may indicate that the first bank signal 254 is provided to the second selection circuit 297. In response to receiving the bypass signal 260 with the logic one value, the second selection circuit 297 may provide the second selection signal 224 having a logical one value. As a result, the second bank bit line selection circuitry 242 may select the second reference cells 252 for a reference cell read and for comparison with the value of the bit cell 210 at the common data path 238.

In a similar manner, a read operation may occur at the second bank 206 using a selected bit cell and reference cells corresponding to the same word line as the selected bit cell. When the reference cell corresponding to the same word line as the selected bit cell are indicated as bypassed, operation of the reference selection circuitry 202 results in corresponding reference cells of the first bank 204 being selected and used in the data read operation of a bit cell in the second bank 206. As a result, the first reference cells 247 serve as a redundancy to read operations of the second bank 206, and the second reference cells 252 serve as a redundancy to read operations at the first bank 204.

Referring to FIG. 3, a memory including reference selection circuitry 302 is depicted and generally designated 300. The memory 300 includes the reference selection circuitry 302 coupled to a first bank 304 and a second bank 306 of memory. The memory 300 enables a read operation to occur at one of the first bank 304 and the second bank 306 by bypassing a reference cell of the selected bank and instead using a reference cell at a dummy word line of the other of the first bank 304 and the second bank 306.

In a particular embodiment, the first bank 304 includes a first memory unit 343, a second memory unit 344, a third memory unit 345, and a fourth memory unit 346. Each of the memory units 343-346 may include multiple memory cells arranged according to multiple word lines, illustrated as a horizontal dash line, and multiple bit lines, illustrated as a vertical dash line. A particular memory cell (e.g., representative bit cell 310) may include a storage element, such as a magnetic tunnel junction (MTJ) element 392, and a transistor 390. In a particular embodiment, the memory cell includes one or more storage elements and one or more transistors. The memory cells may be accessed by rows of word lines and columns of bit lines. For example, the first memory unit 343 may include five hundred and twelve rows of memory cells arranged horizontally and eight columns of memory cells arranged vertically. The first memory unit 343 may be referred to as an input/output (I/O) and may be accessible by the reference selection circuitry 302. Each of the second memory unit 344, the third memory unit 345, and the fourth memory unit 346 may be arranged in a substantially similar manner as the first memory unit 343.

The first bank 304 includes first reference cells 347. The first reference cells 347 may include multiple memory cells arranged in an array of columns and rows. For example, the first reference cells 347 may include two columns of memory cells arranged in five hundred and twelve rows. One of the columns of the first reference cells 347 may include memory cells that all store a logical zero value, and the other column of reference cells may include memory cells that all store a logical one value.

In a particular embodiment, first bank bit line selection circuitry 340 is coupled to the memory units 343-346 and to the first reference cells 347. For example, the first bank bit line selection circuitry 340 may be configured to select one of the bit lines based on a multi-bit input signal, and to select a same bit line in each of the memory units 343-346. Where each memory unit 343-346 includes eight bit lines, the first bank bit line selection circuitry 340 may be responsive to a three bit input signal to select a single bit line of each of the memory units 343-346.

In a particular embodiment, the second bank 306 includes a fifth memory unit 348, a sixth memory unit 349, a seventh memory unit 350, and an eighth memory unit 351. The second bank 306 also includes second reference cells 352. In a particular embodiment, the memory units 348-351 are substantially similar to the memory units 343-346, and the second reference cells 352 are substantially similar to the first reference cells 347. The memory units 348-351 of the second bank 306 are coupled to second bank bit line selection circuitry 342. The second bank bit line selection circuitry 342 may operate in a substantially similar manner as the first bank bit line selection circuitry 340.

In a particular embodiment, the second bank 306 is coupled to a dummy word line 380. The dummy word line 380 may be a redundant word line that provides additional cells that may be used to replace cells in the second bank 306. The dummy word line 380 may include dummy bit cells but functional reference cells. The first bank 304 may also include a dummy word line. The dummy word line 380 may not correspond to an addressable word line. For example, the dummy word line 380 may only be accessed by the first bank 304 in a bypass condition.

In a particular embodiment, the first bank 304 and the second bank 306 are each coupled to a common data path 338. For example, the common data path 338 may include a current sense amplifier 308 and a common write driver 353 that are each used during a memory access to the fourth memory unit 346 or the eighth memory unit 351. In a particular embodiment, the current sense amplifier 308 behaves in a substantially similar manner as described with respect to the sense amplifier 108 of FIG. 1. For example, the current sense amplifier 308 may provide a differential voltage signal to a voltage amplifier (not shown). In a particular embodiment, the common write driver 353 may be configured to enable write operations to a selected memory cell of a selected memory unit at a selected bank. Although only a single current sense amplifier 308 and common write driver 353 are illustrated in FIG. 3, the common data path 338 may include multiple current sense amplifiers, multiple common write drivers, or any combination thereof.

In a particular embodiment, the reference selection circuitry 302 is the reference selection circuitry 202 of FIG. 2 modified to access the reference cells of the dummy word line of the non-selected bank rather than the reference cells of the selected word line in a bypass operation. The reference selection circuitry 302 may be configured to provide a first word line selection signal 366 to select a particular word line of the memory units 343-346 and a first selection signal 322 to the first bank and to the first bit line selection circuitry 340. In a particular embodiment, the first selection signal 322 indicates a particular bit line. The reference selection circuitry 302 may be configured to provide a second word line selection signal 364 to select a particular word line of the memory units 348-351 and a second selection signal 324 to the second bank of the bit line selection circuitry 342. The reference selection circuitry 302 may be configured to produce a bank selector signal 362 to the common data path 338 to enable reads via the current sense amplifier 308 or writes via the common write driver 353.

During operation, a particular bit cell may be addressed for a data read, such as the representative bit cell 310 of the first memory unit 343. The reference selection circuitry 302 may provide the first word line selection signal 366 that selects a word line in the first bank 304 corresponding to the particular bit cell 310. When the reference cells of the first reference cells 347 corresponding to the selected word line, illustrated as circled reference cells within the first reference cells 347, are operative and indicated as not bypassed, a data read operation may be performed using the first reference cells 347 of the first bank 304. A current sense amplifier, such as the current sense amplifier 308, may receive signals from the bit cell 310 and the first reference cells 347 of the first bank 304 and may provide an output to a voltage sense amplifier (not shown).

However, when the reference cells corresponding to the selected word line of the bit cell 310 are indicated as bypassed, the reference selection circuitry 302 may provide the second selection signal 324 to the second bank. As a result, the second bank bit line selection circuitry 342 may select a dummy reference cell 316 on the dummy word line 380 for a reference cell read and for comparison with the value of the bit cell 310 at the common data path 338.

In a similar manner, a read operation may occur at the second bank 306 using a selected bit cell and reference cells corresponding to the same word line as the selected bit cell. When the reference cell corresponding to the same word line as the selected bit cell in the second bank 306 is indicated as bypassed, the reference selection circuitry 302 may use a reference cell on a second dummy word line (not shown) coupled to the first bank 304 during a read operation of the second bank 306. As a result, the reference cells (e.g., the dummy reference cell 316) accessible via the dummy word line 380 serve as a redundancy to read operations of the first bank 304 and the reference cells on a dummy word line of the first bank 304 serve as a redundancy to the second bank 306.

Figure 4:
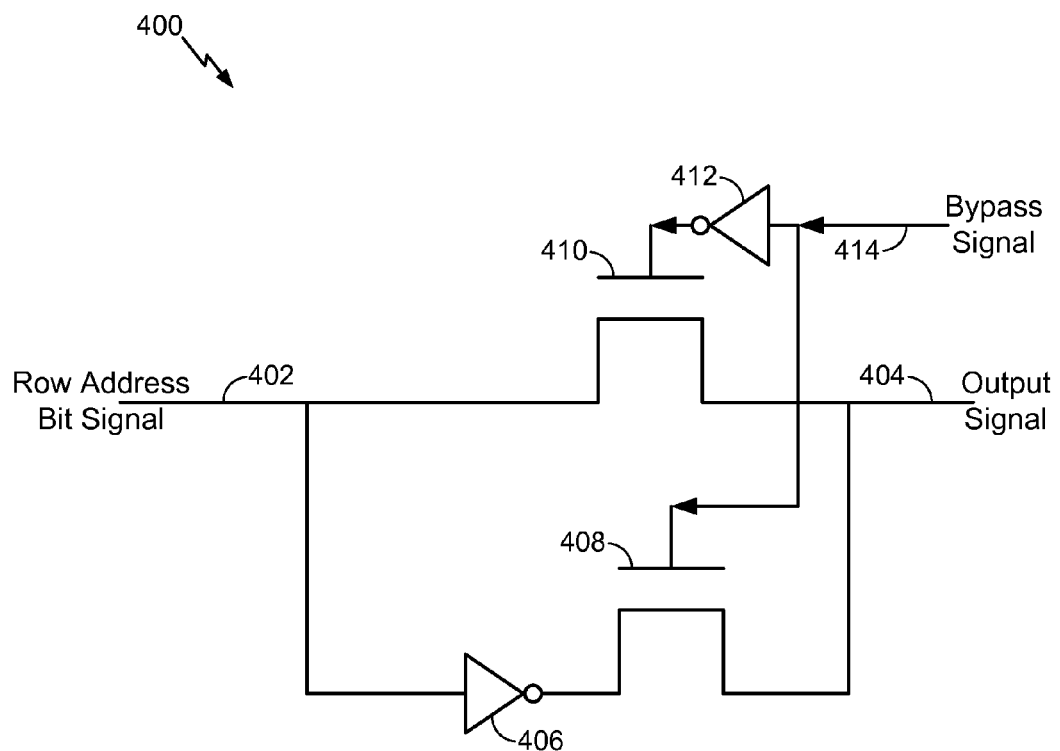
FIG. 4 is a diagram of row address offset circuitry.

Referring to FIG. 4, a row address offset circuit that may be used in conjunction with the memory of FIG. 2 is depicted and generally designated 400. The row address offset circuit 400 includes a first switch 408 coupled to a second switch 410. A row address bit signal 402 is provided to an input of the second switch 410 and an inverted row address bit signal is generated by an inverter 406 and is provided to an input of the first switch 408. An output of the first switch 408 and of the second switch 410 is provided as an output signal 404 of the row address offset circuit 400. A bypass signal 414 may be provided to a control gate of the first switch 408 and is inverted by a second inverter 412 to generate an inverted bypass signal to a control gate of the second switch 410.

In a particular embodiment, each of the first switch 408 and the second switch 410 is a n-channel field effect transistor (NFET). The row address offset circuit 400 may be operative to receive the row address bit signal 402 and to provide the output signal 404 corresponding to the input signal 402 when the bypass signal 414 has a zero value and to provide the inverse of the row address bit signal 402 when the bypass signal 414 has a logical one value. As a result, when the row address bit signal 402 corresponds to a lowest order or zero order bit of the row address, the row address offset circuit 400 may be operative to "flip" the zero order bit of the row address to select an adjacent row either immediately above or below a requested row, such as by selecting a word line above or below a selected word line at the memory 200 of FIG. 2. To illustrate, the row address offset circuit 400 may be coupled to receive the row address 218 and to provide an output to the first row decoder 270 and to the second row decoder 268 of FIG. 2.

In a particular embodiment, the memory 200 of FIG. 2 is modified with the row address offset circuit 400 of FIG. 4 such that when the row address 218 for a read operation indicates that the first reference cells 247 in the first bank 204 are bypassed, the address corresponding to the second bank 206 may be provided again to the bypass circuit 236. For example, the reference selection circuitry 202 of FIG. 2 may use the address offset circuitry 400 to modify a row address (e.g., the row address 218) of a bit cell (e.g., the bit cell 210) to access a reference cell (e.g., the second reference cell 216). The address of the memory cell 210 may include a bank bit, followed by a series of bits indicating a word line, followed by a series of bits indicating a column. The first comparison of the bypass circuit 236 may be used with the requested bank, such as a zero value for the first bank 204, and upon determining a match within the set of addresses 280, the bypass circuit 236 may be accessed again with a one value in the bank bit position, indicating the requested word line in the second bank 206. In response to the bypass circuit 236 indicating that the second reference cells 252 corresponding to the row address are also indicated as bypassed, the bypass signal of the second bypass access may be provided as the bypass signal 414 to change the low order word line bit to indicate an adjacent word line.

In a particular embodiment, the row address offset circuit 400 may be applied to more than just a low order bit of a row address, and alternatively, or in addition, may be applied to one or more other bits within the row address, so that the row address may be systematically and iteratively modified until a row address of a reference cell that is indicated as not bypassed is determined.

Figure 5:
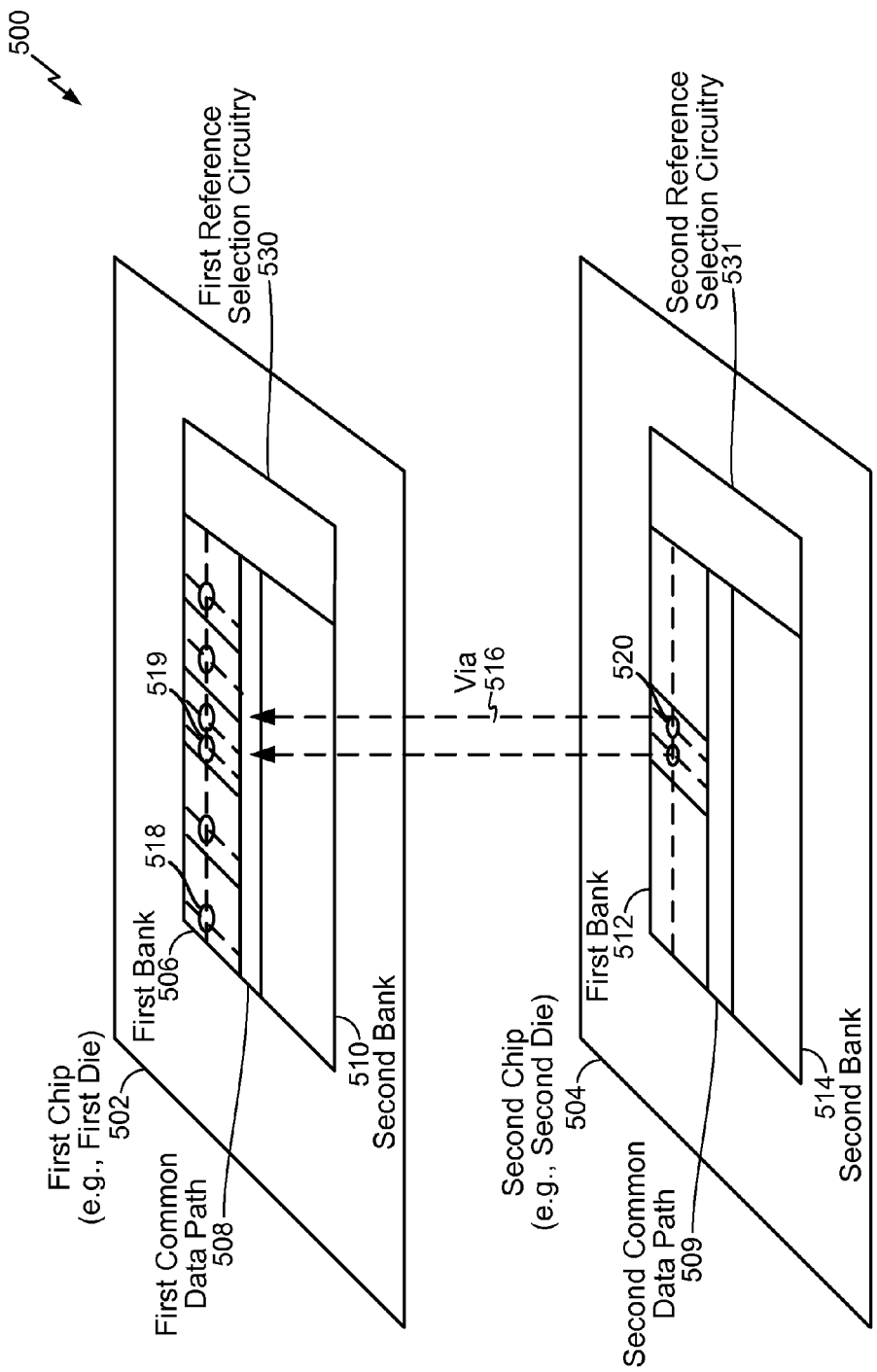
FIG. 5 is a general diagram of a fourth illustrative embodiment of a memory including reference selection circuitry.

Referring to FIG. 5, a memory including first reference selection circuitry 530 and second reference selection circuitry 531 is depicted and generally designated 500. The memory 500 may include a first chip 502 and a second chip 504. For example, the memory 500 may include a stack of dies. The first chip 502 may include a first bank 506, a second bank 510, and a first common data path 508 coupled to the first reference selection circuitry 530. The second chip 504 includes a first bank 512, a second bank 514 and a second common data path 509 coupled to the second reference selection circuitry 531. The first chip 502 may be electrically coupled to the second chip 504 through a via 516. The via 516 may include an electrically conductive path extending between the first chip 502 and the second chip 504. The via 516 may be one of multiple vias coupling the first chip 502 and the second chip 504. The memory 500 may enable a read operation to occur at one of the first bank 506 and the second bank 510 of the first chip 502 by bypassing a reference cell of the selected bank and instead using a reference cell of a bank on the second chip 504.

In a particular embodiment, the first bank 506 includes multiple memory cells arranged according to multiple word lines, illustrated as a horizontal dash line, and multiple bit lines, illustrated as a vertical dash line. For example, the first bank 506 may include five hundred and twelve rows of memory cells arranged horizontally and thirty-four columns of memory cells arranged vertically.

The first bank 506 of the first chip 502 includes first reference cells 519. The first reference cells 519 may include multiple memory cells arranged in an array of columns and rows. For example, the first reference cells 519 may include two columns of memory cells arranged in five hundred and twelve rows. One of the columns of the reference cells 519 may include memory cells that all store a logical zero value, and the other column of reference cells may include memory cells that all store a logical one value. In a particular embodiment, the second bank 510 of the first chip 502, the first bank 512 of the second chip 504, and the second bank 514 of the second chip 504 are arranged in a substantially similar manner as the first bank 506 of the first chip 502.

The first bank 506 and the second bank 510 of the first chip 502 may be each coupled to the first common data path 508. In a particular embodiment, the first common data path 508 is configured to enable write operations to a selected memory cell at a selected bank. The first reference selection circuitry 530 may be configured to select the reference cell to be accessed by the first common data path 508. The second reference selection circuitry 531 and the second common data path 509 may be configured to perform in a substantially similar manner as the first reference selection circuitry 530 and the first common data path 508, respectively.

During operation, a particular bit may be addressed for a read operation, such as the representative bit cell 518 of the first bank 506 of the first chip 502. When the reference cells corresponding to a selected word line that includes the bit cell 518, illustrated as circled reference cells 519, are operative and indicated as not bypassed, a data read operation may be performed using the reference cells of the first bank 506 of the first chip 502. In this case, the first common data path 508 may receive signals from the bit cell 518 and the first reference cells 519 of the first bank 506 of the first chip 502.

However, when the first reference cells 519 corresponding to the selected word line of the bit cell 518 are indicated as bypassed, the first reference selection circuitry 530 may select the second reference cells 520 from the second chip 504. As a result, the second reference cells 520 of the second chip 504 may be read by the first common data path 508 of the first chip 502 through the via 516. For example, the memory 500 may be a stack of dies such that the first reference selection circuitry 530 may select a bit cell (e.g., the bit cell 518) on a first bank (e.g., the first bank 506) integrated on a first die (e.g., the first chip 502) and may select a reference cell (e.g., the second reference cells 520) on a second bank (e.g., the first bank 512) integrated on a second die (e.g., the second chip 504).

In a similar manner, a read operation may occur at the second chip 504 using a selected bit cell and reference cells corresponding to the same word line as the selected bit cell. When the reference cells corresponding to the same word line as the selected memory cell are indicated as bypassed, the second reference selection circuitry 531 may use one or more reference cells on a bank of the first chip 502 during a read operation of the second chip 504.

Figure 6:
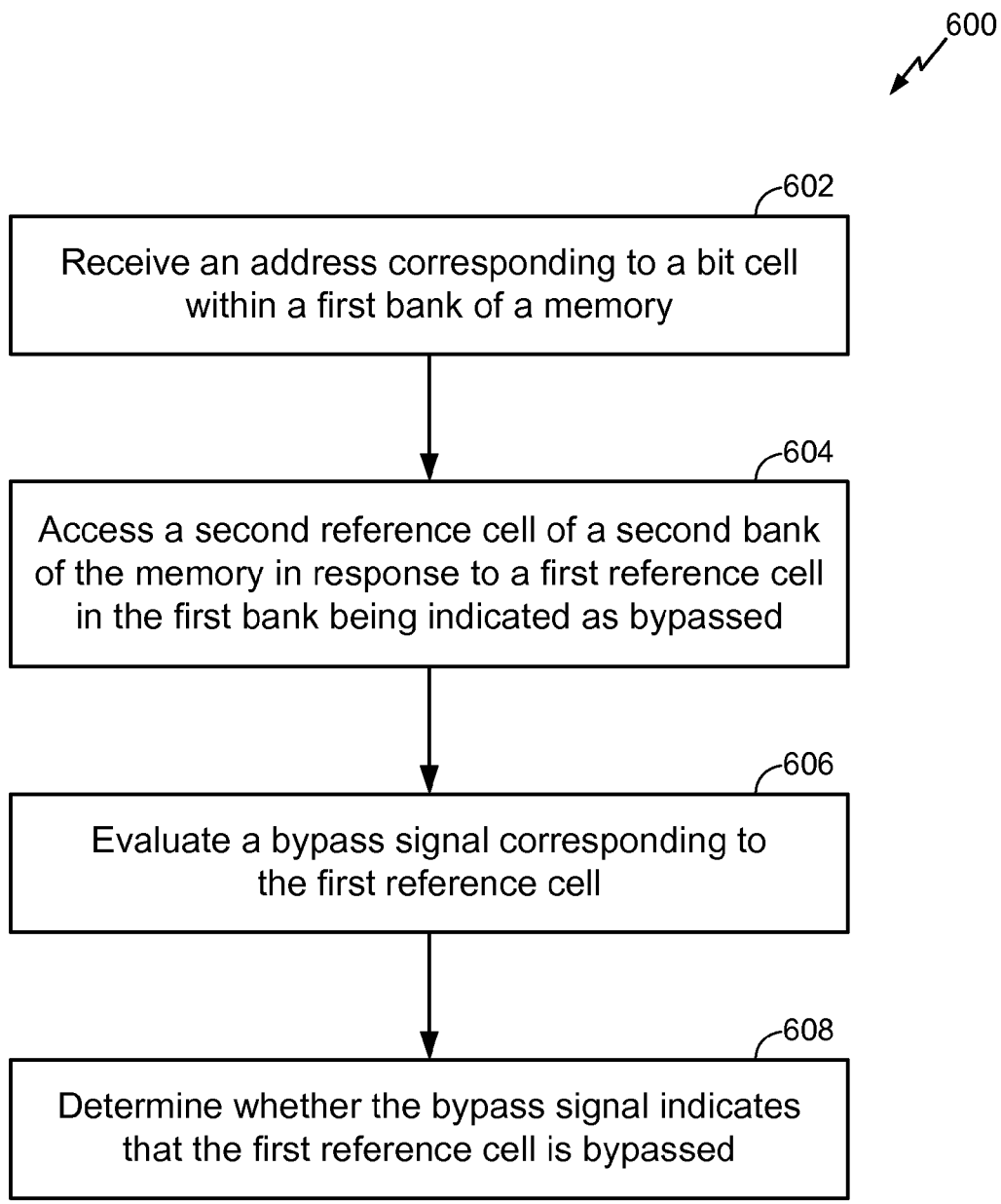
FIG. 6 is a flow chart of a particular illustrative embodiment of a method of reference cell selection.

Referring to FIG. 6, a method to select a reference cell is disclosed and is generally designated 600. The method 600 includes receiving an address corresponding to a bit cell within a first bank of a memory, at 602. For example, the reference selection circuitry 202 of FIG. 2 receives the row address 218 corresponding to the bit cell 210 within the first bank 204 of the memory 200. The address may include a first row address and a first bank address. For example, the address of the data cell 210 of FIG. 2 includes the first row address 283 and the first bank address 285.

The method 600 also includes accessing a second reference cell of a second bank of the memory in response to a first reference cell in the first bank being indicated as bypassed, at 604. For example, the reference selection circuitry 202 of FIG. 2 accesses the second reference cell 216 of the second bank 206 in response to the first reference cells 247 in the first bank 204 being indicated as bypassed. The reference cell in the first bank may be a failed cell or a marginally operative cell. The reference cell may be coupled to a same word line as the bit cell. For example, the first reference cells 247 of FIG. 2 may include cells that are coupled to the bit cell 210 and may be failed or marginally operative.

The second reference cell may be indicated by a row address. The second reference cell may have the same first row address as the bit cell with a different bank address. For example, the second reference cell 216 of FIG. 2 may have the first row address 283 and a second bank address 287. Alternatively, the second reference cell may have a different row address than the bit cell. For example, the second reference cell 216 of FIG. 2 may be indicated by an address that includes a second row address 286 and the second bank address 287. The second reference cell may be coupled to a dummy word line. For example, the dummy reference cell 316 of FIG. 3 is coupled to the dummy word line 380.

The first bank and the second bank may share a common data path. For example, the first bank 204 and the second bank 206 of FIG. 2 share the common data path 238. The common data path may include a sense amplifier and a write driver. For example, the common data path 238 of FIG. 2 includes the sense amplifier 208 and the write driver 253. The sense amplifier may be configured to amplify a first read data signal from the first bank and a second read data signal from the second bank. For example, the sense amplifier 108 of FIG. 1 may amplify a difference in the output 130 of the first bit cell 110 from the first bank 104 and the output 126 of the second reference cell 116 from the second bank 106. The write driver may be configured to provide a first write data signal to the first bank and a second write data signal to the second bank. For example, the common write driver 253 of FIG. 2 may write to the first bank 204 and the second bank 206.

The method 600 may also include evaluating a bypass signal corresponding to the first reference cell, at 606. For example, the reference selection circuitry 202 of FIG. 2 evaluates the bypass signal 260 corresponding to the first reference cells 247. The bypass signal may be generated based on a comparison of the address with a set of addresses corresponding to bypassed reference cells. The set of address corresponding to the bypassed reference cells may be stored at a fuse array. For example, the bypass circuit 236 of FIG. 2 may generate the bypass signal 260 based on a comparison of the row address 218 with the fuse address 275 corresponding to the set of addresses of bypassed reference cells 280 stored at the fuse array 274.

The method 600 may also include determining whether the bypass signal indicates that the first reference cell is bypassed, at 608. For example, the reference selection circuitry 202 of FIG. 2 determines whether the bypass signal 260 indicates that the first reference cells 247 are bypassed.

The reference selection circuitry may be used to select a reference cell on a different chip than the bit cell that is being read. For example, the first bank may be located at a first chip and the second bank may be located at a second chip that is coupled to the first chip using at least one via. To illustrate, the first bank 506 of the first chip 502 of FIG. 5 is coupled to the first bank 512 of the second chip 504 by the via 516.

Figure 7:
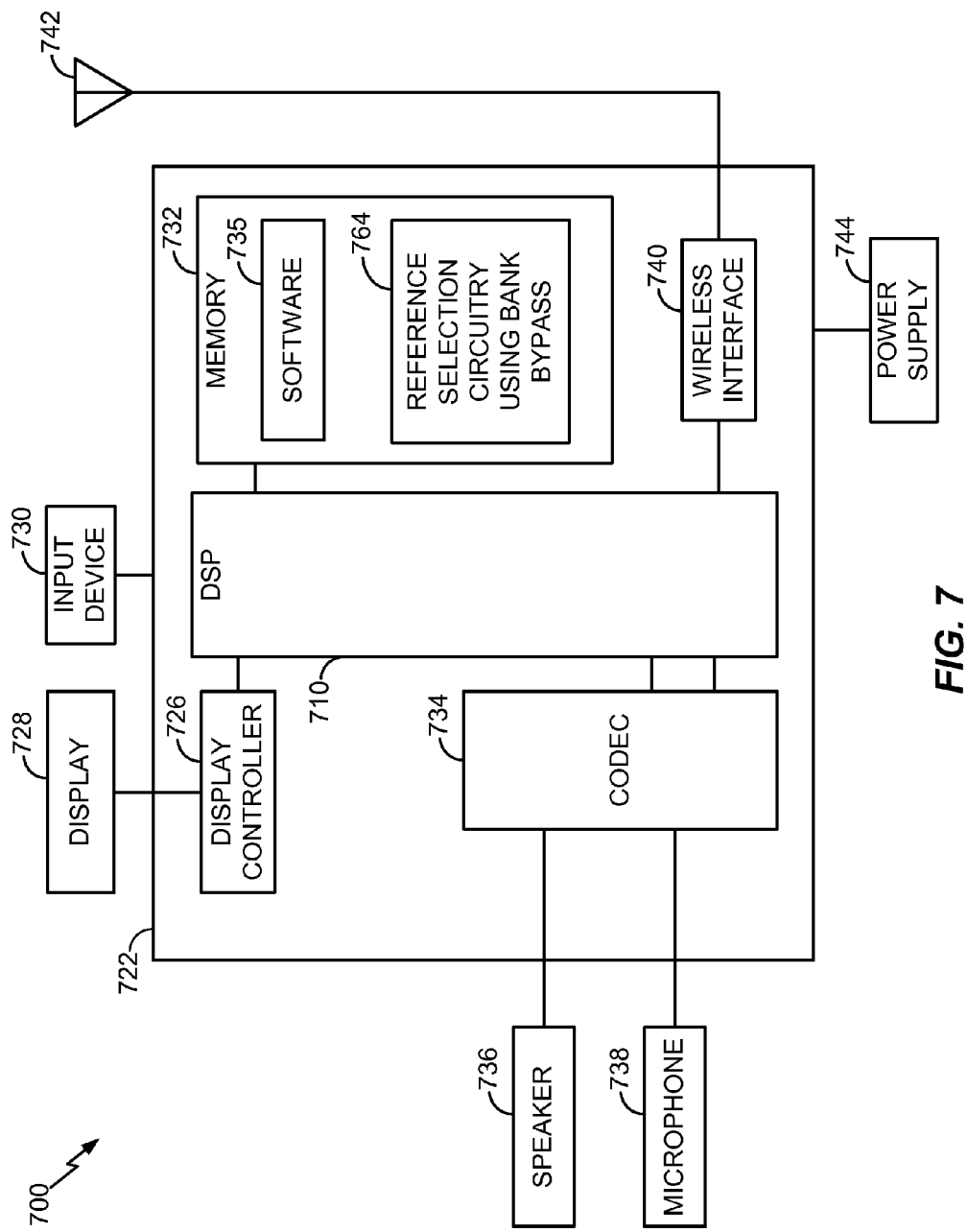
FIG. 7 is a block diagram of a particular embodiment of a wireless communication device that includes reference selection circuitry.

FIG. 7 is a block diagram of an embodiment of a wireless communication device 700 having a circuit that selects a reference cell used to determine a data value of a bit cell in a memory 732 (e.g., reference selection circuitry using bank bypass 764). The wireless communication device 700 may be implemented as a portable wireless electronic device that includes a processor 710, such as a digital signal processor (DSP), coupled to a memory 732.

The reference selection circuitry using bank bypass 764 is responsive to a bypass signal associated with a reference cell in a first bank to access a reference cell in a second bank. For example, the reference selection circuitry using bank bypass 764 may include one or more of the components, memories, or circuits of FIGS. 1-5, operates in accordance with FIG. 6, or any combination thereof. The reference selection circuitry using bank bypass 764 using bank bypass may be at the memory 732 or may be a separate device. Although the reference selection circuitry using bank bypass 764 is illustrated integrated with the memory 732, in other embodiments the reference selection circuitry using bank bypass 764 may be external to the memory 732.

In a particular embodiment, a display controller 726 is coupled to the processor 710 and to a display device 728. A coder/decoder (CODEC) 734 can also be coupled to the processor 710. A speaker 736 and a microphone 738 can be coupled to the CODEC 734. A wireless controller 740 can be coupled to the processor 710 and to a wireless antenna 742.

The memory 732 may include a computer readable medium that stores instructions (e.g., software 735) that are executable by a processor, such as the processor 710. For example, the software 735 may include instructions that are executable by a computer to receive an address (e.g., the address 118 of FIG. 1) corresponding to a bit cell (e.g., the first bit cell 110) within a first bank (e.g., the first bank 104) of a memory (e.g., the memory 100). The software 735 may also include instructions that are executable by a computer to access a second reference cell (e.g., the second reference cell 116 of FIG. 2) of a second bank (e.g., the second bank 106) of the memory (e.g., the memory 100) in response to a first reference cell (e.g., the first reference cell 114) in the first bank (e.g., the first bank 104) being indicated as bypassed.

In a particular embodiment, the signal processor 710, the display controller 726, the memory 732, the CODEC 734, and the wireless controller 740 are included in a system-in-package or system-on-chip device 722. In a particular embodiment, an input device 730 and a power supply 744 are coupled to the system-on-chip device 722. Moreover, in a particular embodiment, as illustrated in FIG. 7, the display device 728, the input device 730, the speaker 736, the microphone 738, the wireless antenna 742, and the power supply 744 are external to the system-on-chip device 722. However, each of the display device 728, the input device 730, the speaker 736, the microphone 738, the wireless antenna 742, and the power supply 744 can be coupled to a component of the system-on-chip device 722, such as an interface or a controller.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above.

Figure 8:
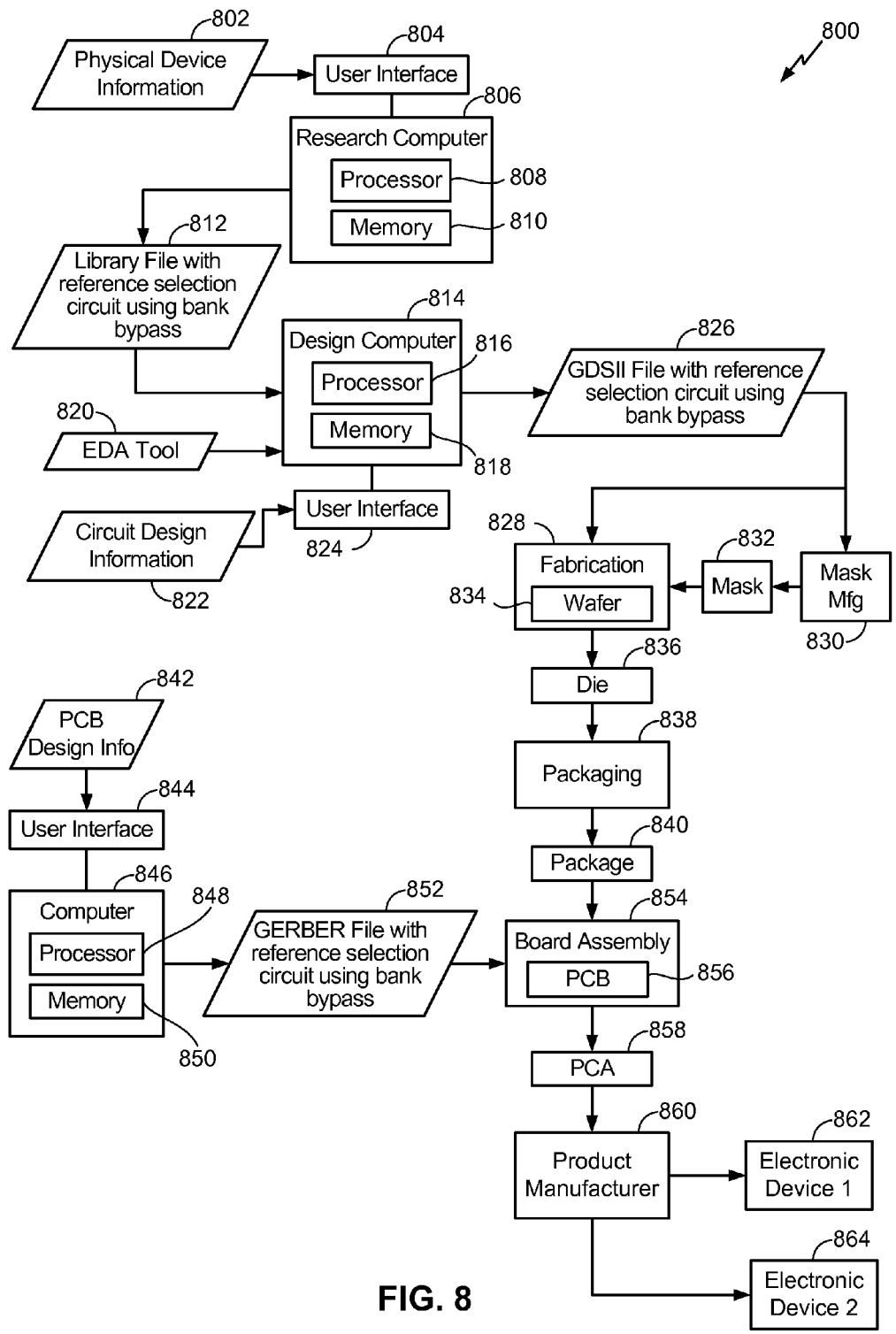
FIG. 8 is a data flow diagram illustrating a manufacturing process for use with a device that includes reference selection circuitry.

FIG. 8 depicts a particular illustrative embodiment of an electronic device manufacturing process 800. Physical device information 802 is received at the manufacturing process 800, such as at a research computer 806. The physical device information 802 may include design information representing at least one physical property of a semiconductor device, such as the memory 100 of FIG. 1, the memory 200 of FIG. 2, the memory 300 of FIG. 3, the row address offset circuit 400 of FIG. 4, the memory 500 of FIG. 5, or any combination thereof. For example, the physical device information 802 may include physical parameters, material characteristics, and structure information that is entered via a user interface 804 coupled to the research computer 806. The research computer 806 includes a processor 808, such as one or more processing cores, coupled to a computer readable medium such as a memory 810. The memory 810 may store computer readable instructions that are executable to cause the processor 808 to transform the physical device information 802 to comply with a file format and to generate a library file 812.

In a particular embodiment, the library file 812 includes at least one data file including the transformed design information. For example, the library file 812 may include a library of semiconductor devices including a device that includes the memory 100 of FIG. 1, a device that includes the memory 200 of FIG. 2, a device that includes the memory 300 of FIG. 3, a device that includes the row address offset circuit 400 of FIG. 4, a device that includes the memory 500 of FIG. 5, or any combination thereof, that is provided to use with an electronic design automation (EDA) tool 820.

The library file 812 may be used in conjunction with the EDA tool 820 at a design computer 814 including a processor 816, such as one or more processing cores, coupled to a memory 818. The EDA tool 820 may be stored as processor executable instructions at the memory 818 to enable a user of the design computer 814 to design a circuit including a device that includes the memory 100 of FIG. 1, a device that includes the memory 200 of FIG. 2, a device that includes the memory 300 of FIG. 3, a device that includes the row address offset circuit 400 of FIG. 4, a device that includes the memory 500 of FIG. 5, or any combination thereof, of the library file 812. For example, a user of the design computer 814 may enter circuit design information 822 via a user interface 824 coupled to the design computer 814. The circuit design information 822 may include design information representing at least one physical property of a semiconductor device, such as a device that includes the memory 100 of FIG. 1, a device that includes the memory 200 of FIG. 2, a device that includes the memory 300 of FIG. 3, a device that includes the row address offset circuit 400 of FIG. 4, a device that includes the memory 500 of FIG. 5, or any combination thereof. To illustrate, the circuit design property may include identification of particular circuits and relationships to other elements in a circuit design, positioning information, feature size information, interconnection information, or other information representing a physical property of a semiconductor device.

The design computer 814 may be configured to transform the design information, including the circuit design information 822, to comply with a file format. To illustrate, the file formation may include a database binary file format representing planar geometric shapes, text labels, and other information about a circuit layout in a hierarchical format, such as a Graphic Data System (GDSII) file format. The design computer 814 may be configured to generate a data file including the transformed design information, such as a GDSII file 826 that includes information describing the memory 100 of FIG. 1, the memory 200 of FIG. 2, the memory 300 of FIG. 3, the row address offset circuit 400 of FIG. 4, the memory 500 of FIG. 5, or any combination thereof, in addition to other circuits or information. To illustrate, the data file may include information corresponding to a system-on-chip (SOC) that includes the memory 100 of FIG. 1 and that also includes additional electronic circuits and components within the SOC.

The GDSII file 826 may be received at a fabrication process 828 to manufacture information describing the memory 100 of FIG. 1, the memory 200 of FIG. 2, the memory 300 of FIG. 3, the row address offset circuit 400 of FIG. 4, the memory 500 of FIG. 5, or any combination thereof, according to transformed information in the GDSII file 826. For example, a device manufacture process may include providing the GDSII file 826 to a mask manufacturer 830 to create one or more masks, such as masks to be used with photolithography processing, illustrated as a representative mask 832. The mask 832 may be used during the fabrication process to generate one or more wafers 834, which may be tested and separated into dies, such as a representative die 836. The die 836 includes a circuit including a device that includes the memory 100 of FIG. 1, a device that includes the memory 200 of FIG. 2, a device that includes the memory 300 of FIG. 3, a device that includes the row address offset circuit 400 of FIG. 4, a device that includes the memory 500 of FIG. 5, or any combination thereof.

The die 836 may be provided to a packaging process 838 where the die 836 is incorporated into a representative package 840. For example, the package 840 may include the single die 836 or multiple dies, such as a system-in-package (SiP) arrangement. The package 840 may be configured to conform to one or more standards or specifications, such as Joint Electron Device Engineering Council (JEDEC) standards.

Information regarding the package 840 may be distributed to various product designers, such as via a component library stored at a computer 846. The computer 846 may include a processor 848, such as one or more processing cores, coupled to a memory 850. A printed circuit board (PCB) tool may be stored as processor executable instructions at the memory 850 to process PCB design information 842 received from a user of the computer 846 via a user interface 844. The PCB design information 842 may include physical positioning information of a packaged semiconductor device on a circuit board, the packaged semiconductor device corresponding to the package 840 including the memory 100 of FIG. 1, the memory 200 of FIG. 2, the memory 300 of FIG. 3, the row address offset circuit 400 of FIG. 4, the memory 500 of FIG. 5, or any combination thereof.

The computer 846 may be configured to transform the PCB design information 842 to generate a data file, such as a GERBER file 852 with data that includes physical positioning information of a packaged semiconductor device on a circuit board, as well as layout of electrical connections such as traces and vias, where the packaged semiconductor device corresponds to the package 840 including the memory 100 of FIG. 1, the memory 200 of FIG. 2, the memory 300 of FIG. 3, the row address offset circuit 400 of FIG. 4, the memory 500 of FIG. 5, or any combination thereof. In other embodiments, the data file generated by the transformed PCB design information may have a format other than a GERBER format.

The GERBER file 852 may be received at a board assembly process 854 and used to create PCBs, such as a representative PCB 856, manufactured in accordance with the design information stored within the GERBER file 852. For example, the GERBER file 852 may be uploaded to one or more machines to perform various steps of a PCB production process. The PCB 856 may be populated with electronic components including the package 840 to form a representative printed circuit assembly (PCA) 858.

The PCA 858 may be received at a product manufacture process 860 and integrated into one or more electronic devices, such as a first representative electronic device 862 and a second representative electronic device 864. As an illustrative, non-limiting example, the first representative electronic device 862, the second representative electronic device 864, or both, may be selected from the group of a set top box, a music player, a video player, an entertainment unit, a navigation device, a communications device, a personal digital assistant (PDA), a fixed location data unit, and a computer, into which the reference selection circuitry using bank bypass 764 is integrated. As another illustrative, non-limiting example, one or more of the electronic devices 862 and 864 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 8 illustrates remote units according to teachings of the disclosure, the disclosure is not limited to these exemplary illustrated units. Embodiments of the disclosure may be suitably employed in any device which includes active integrated circuitry including memory and on-chip circuitry.

A device that includes the memory 100 of FIG. 1, a device that includes the memory 200 of FIG. 2, a device that includes the memory 300 of FIG. 3, a device that includes the row address offset circuit 400 of FIG. 4, a device that includes the memory 500 of FIG. 5, or any combination thereof, may be fabricated, processed, and incorporated into an electronic device, as described in the illustrative process 800. One or more aspects of the embodiments disclosed with respect to FIGS. 1-5 may be included at various processing stages, such as within the library file 812, the GDSII file 826, and the GERBER file 852, as well as stored at the memory 810 of the research computer 806, the memory 818 of the design computer 814, the memory 850 of the computer 846, the memory of one or more other computers or processors (not shown) used at the various stages, such as at the board assembly process 854, and also incorporated into one or more other physical embodiments such as the mask 832, the die 836, the package 840, the PCA 858, other products such as prototype circuits or devices (not shown), or any combination thereof. Although various representative stages of production from a physical device design to a final product are depicted, in other embodiments fewer stages may be used or additional stages may be included. Similarly, the process 800 may be performed by a single entity or by one or more entities performing various stages of the process 800.

Those of skill would further appreciate that the various illustrative logical blocks, configurations, modules, circuits, and method steps described in connection with the embodiments disclosed herein may be implemented as electronic hardware, computer software executed by a processing unit, or combinations of both. Various illustrative components, blocks, configurations, modules, circuits, and steps have been described above generally in terms of their functionality. Whether such functionality is implemented as hardware or executable processing instructions depends on the particular application and design constraints imposed on the overall system. Skilled artisans may implement the described functionality in varying ways with each particular application, but such implementation decisions should not be interpreted as causing a departure from the scope of the present disclosure.

A software module may reside in random access memory (RAM), a magnetoresistive random access memory (MRAM), a spin-torque-transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
   receiving an address corresponding to a bit cell within a first bank of a memory, wherein the first bank comprises the bit cell, a first plurality of word lines, and a first reference cell, wherein the bit cell stores a first value, and wherein the address includes a first row address and a first bank address;
   accessing a second reference cell of a second bank of the memory during a read operation of the bit cell within the first bank of the memory in response to the first reference cell in the first bank being indicated as bypassed, wherein the second bank comprises a second plurality of word lines that is distinct from the first plurality of word lines, wherein the second bank does not include the first plurality of word lines, wherein the second reference cell has a second row address and a second bank address, and wherein the second row address is determined based on the first row address; and
   determining an output of the bit cell during the read operation based on the first value and a second value of the second reference cell when the first reference cell is indicated as bypassed.

2. The method of claim 1, further comprising:
   evaluating a bypass signal corresponding to the first reference cell; and
   determining whether the bypass signal indicates that the first reference cell is bypassed.

3. The method of claim 2, wherein the bypass signal is generated based on a comparison of the address with a set of addresses corresponding to bypassed reference cells.

4. The method of claim 3, wherein the set of addresses corresponding to the bypassed reference cells is stored at a fuse array.

5. The method of claim 2, wherein the bypass signal is received from a device external to the memory.

6. The method of claim 1, wherein the first reference cell in the first bank is a failed cell.

7. The method of claim 1, wherein the first reference cell in the first bank is a marginally operative cell.

8. The method of claim 1, wherein the first reference cell is coupled to a same word line as the bit cell.

9. The method of claim 1, wherein the first bank and the second bank share a common data path.

10. The method of claim 9, wherein the common data path includes a sense amplifier and a write driver, wherein the sense amplifier is configured to amplify a first read data signal from the first bank and further configured to amplify a second read data signal from the second bank, and wherein the write driver is configured to provide a first write data signal to the first bank and further configured to provide a second write data signal to the second bank.

11. The method of claim 1, wherein the second reference cell is coupled to a dummy word line.

12. The method of claim 1, wherein the second row address is the first row address.

13. The method of claim 1, further comprising receiving a bypass signal from a bypass circuit, wherein the bypass signal is generated by comparing the first row address with a plurality of bypass addresses stored at the bypass circuit.

14. The method of claim 1, wherein the first bank is located at a first chip and wherein the second bank is located at a second chip that is coupled to the first chip using at least one via.

15. The method of claim 1, wherein receiving the address and accessing the second reference cell are performed by a processor integrated into an electronic device.

16. An apparatus comprising:
   a memory comprising:
      a first bank comprising a first bit cell, a first plurality of word lines, and a first reference cell, wherein the first bit cell corresponds to an address that includes a first row address and a first bank address;
      a second bank comprising a second bit cell, a second plurality of word lines, and a second reference cell, wherein the first plurality of word lines is distinct from the second plurality of word lines, wherein the second bank does not include the first plurality of word lines, wherein the second reference cell has a second row address and a second bank address, and wherein the second row address is determined based on the first row address; and reference selection circuitry configured to access the second reference cell during a read operation of the first bit cell in response to receiving a bypass signal indicating the first reference cell as bypassed, wherein the read operation of the first bit cell comprises comparing a first value of the first bit cell to a second value of the second reference cell when the first reference cell is indicated as bypassed.

17. The apparatus of claim 16, wherein the reference selection circuitry comprises a logical gate coupled to receive a bank signal and the bypass signal and to generate a bank selection signal of the second bank in response to the bank signal indicating the first bank and the bypass signal indicating the first reference cell as bypassed.

18. The apparatus of claim 16, wherein the memory comprises a resistance-based memory device.

19. The apparatus of claim 18, wherein the resistance-based memory device comprises a magneto-resistive random access memory (MRAM) or spin-torque transfer MRAM (STT-MRAM).

20. The apparatus of claim 16, wherein the first plurality and the second plurality share row addresses and wherein the second plurality is non-adjacent to the first plurality.

21. The apparatus of claim 20, wherein the first bank and the second bank are coupled to a common sense amplifier.

22. The apparatus of claim 20, wherein the second reference cell is accessible via a dummy word line.

23. The apparatus of claim 20, wherein the reference selection circuitry comprises address offset circuitry to modify the first row address of the first bit cell to access the second reference cell.

24. The apparatus of claim 20, wherein the first bank is integrated on a first die of a stack of dies and the second bank is integrated on a second die of the stack of dies.

25. The apparatus of claim 16, further comprising a fuse array programmable to store an address of bypassed reference cell and comprising comparison circuitry to generate the bypass signal in response to an input address matching the address of the bypassed reference cell.

26. The apparatus of claim 16, wherein the memory is integrated in at least one semiconductor die.

27. The apparatus of claim 16, further comprising a device selected from a set top box, a music player, a video player, an entertainment unit, a navigation unit, a communications device, a personal digital assistant (PDA), a fixed location data unit, and a computer, into which the memory is integrated.

28. An apparatus comprising:
means for accessing a first bit cell and a first reference cell in a first bank of a memory, wherein the first bank comprises a first plurality of word lines, wherein the first bit cell is associated with an address that includes a first row address and a first bank address;
means for accessing a second bit cell and a second reference cell in a second bank of the memory, wherein the second bank comprises a second plurality of word lines that is distinct from the first plurality of word lines, wherein the second bank does not include the first plurality of word lines, wherein the second reference cell has the first row address and a second bank address;
means for receiving a bypass signal indicating the first reference cell in the first bank of the memory as bypassed;
means for accessing the second reference cell in the second bank of the memory during a read operation of the first bit cell in response to the bypass signal being received by the means for receiving; and
means for comparing a first value of the first bit cell to a second value of the second reference cell during the read operation when the first reference cell is indicated as bypassed.

29. The apparatus of claim 28 integrated in at least one semiconductor die.

30. The apparatus of claim 28, further comprising a device selected from a set top box, a music player, a video player, an entertainment unit, a navigation unit, a communications device, a personal digital assistant (PDA), a fixed location data unit, and a computer, into which the memory is integrated.

31. A method comprising:
a first step for receiving an address corresponding to a first bit cell within a first bank of a memory, wherein the first bank includes a first plurality of word lines, and wherein the address includes a first row address and a first bank address;
a second step for accessing a second reference cell of a second bank of the memory during a read operation of the bit cell within the first bank of the memory in response to a first reference cell in the first bank being indicated as bypassed, wherein the second bank includes a second plurality of word lines that is distinct from the first plurality of word lines, wherein the second bank does not include the first plurality of word lines, wherein the second reference cell has a second row address and a second bank address, and wherein the second row address is determined based on the first row address; and
a third step for comparing a first value of the first bit cell to a second value of the second reference cell during the read operation when the first reference cell is indicated as bypassed.

32. The method of claim 31, wherein the first step and the second step are performed by a processor integrated into an electronic device.

33. A non-transitory computer readable medium storing processor executable instructions that, when executed by a processor, cause the processor to:
receive an address corresponding to a first bit cell within a first bank of a memory,
wherein the first bank includes a first plurality of word lines, and wherein the address includes a first row address and a first bank address;
access a second reference cell of a second bank of the memory during a read operation of the bit cell within the first bank of the memory in response to a first reference cell in the first bank being indicated as bypassed, wherein the second bank includes a second plurality of word lines that is distinct from the first plurality of word lines, wherein the second bank does not include the first plurality of word lines, wherein the second reference cell has a second row address and a second bank address, and wherein the second row address is determined based on the first row address; and
compare a first value of the first bit cell to a second value of the second reference cell during the read operation when the first reference cell is indicated as bypassed.

34. The non-transitory computer readable medium of claim 33, wherein the processor is integrated in a device selected from a group consisting of a set top box, a music player, a video player, an entertainment unit, a navigation device, a communication device, a personal digital assistant (PDA), a fixed location data unit, and a computer.

35. A method comprising:
receiving, at a computer, design information representing at least one physical property of a semiconductor device, the semiconductor device including a memory, the memory comprising:
a first bank comprising a first bit cell, a first plurality of word lines, and a first reference cell, wherein the first bit cell is associated with an address that includes a first row address and a first bank address;
a second bank comprising a second bit cell, a second plurality of word lines, and a second reference cell, wherein the first plurality of word lines is distinct from the second plurality of word lines, wherein the second bank does not include the first plurality of word lines, wherein the second reference cell has a second row address and a second bank address, and wherein the second row address is determined based on the first row address; and
reference selection circuitry configured to access the second reference cell during a read operation of the first bit cell in response to receiving a bypass signal indicating the first reference cell as bypassed, wherein the read operation of the first bit cell comprises comparing a first value of the first bit cell to a second value of the second reference cell when the first reference cell is indicated as bypassed;
transforming, at the computer, the design information to comply with a file format; and
generating, at the computer, a data file including the transformed design information.

36. The method of claim 35, wherein the data file includes a GDSII format.

37. A method comprising:
receiving a data file including design information corresponding to a semiconductor device; and
fabricating the semiconductor device according to the design information, wherein the semiconductor device includes:
a memory comprising:
a first bank comprising a first bit cell, a first plurality of word lines, and a first reference cell, wherein the first bit cell is associated with an address that includes a first row address and a first bank address;
a second bank comprising a second bit cell, a second plurality of word lines, and a second reference cell, wherein the first plurality of word lines is distinct from the second plurality of word lines, wherein the second bank does not include the first plurality of word lines, wherein the second reference cell has a second row address and a second bank address, and wherein the second row address is determined based on the first row address; and
reference selection circuitry configured to access the second reference cell during a read operation of the first bit cell in response to receiving a bypass signal indicating the first reference cell as bypassed, wherein the read operation of the first bit cell comprises comparing a first value of the first bit cell to a second value of the second reference cell when the first reference cell is indicated as bypassed.

38. The method of claim 37, wherein the data file includes a GDSII format.

39. A method comprising:
receiving, at a computer, design information including physical positioning information of a packaged semiconductor device on a circuit board, the packaged semiconductor device including a semiconductor structure comprising:
a memory comprising:
a first bank comprising a first bit cell, a first plurality of word lines, and a first reference cell, wherein the first bit cell is associated with an address that includes a first row address and a first bank address;
a second bank comprising a second bit cell, a second plurality of word lines, and a second reference cell, wherein the first plurality of word lines is distinct from the second plurality of word lines, wherein the second bank does not include the first plurality of word lines, wherein the second reference cell has a second row address and a second bank address, and wherein the second row address is determined based on the first row address; and
reference selection circuitry configured to access the second reference cell during a read operation of the first bit cell in response to receiving a bypass signal indicating the first reference cell as bypassed, wherein the read operation of the first bit cell comprises comparing a first value of the first bit cell to a second value of the second reference cell when the first reference cell is indicated as bypassed; and
transforming, at the computer, the design information to generate a data file.

40. The method of claim 39, wherein the data file includes a GERBER format.

41. A method comprising:
receiving a data file including design information including physical positioning information of a packaged semiconductor device on a circuit board; and
manufacturing the circuit board configured to receive the packaged semiconductor device according to the design information, wherein the packaged semiconductor device comprises:
a memory comprising:
a first bank comprising a first bit cell, a first plurality of word lines, and a first reference cell, wherein the first bit cell stores a first value, wherein the first bit cell is associated with an address that includes a first row address and a first bank address;
a second bank comprising a second bit cell, a second plurality of word lines, and a second reference cell, wherein the first plurality of word lines is distinct from the second plurality of word lines, wherein the second bank does not include the first plurality of word lines, wherein the second reference cell has a second row address and a second bank address, and wherein the second row address is determined based on the first row address; and
reference selection circuitry configured to access the second reference cell during a read operation of the first bit cell in response to receiving a bypass signal indicating the first reference cell as bypassed, wherein the read operation of the first bit cell comprises comparing a first value of the first bit cell to a second value of the second reference cell when the first reference cell is indicated as bypassed.

42. The method of claim 41, wherein the data file includes a GERBER format.

43. The method of claim 41, further comprising integrating the circuit board into a device selected from a set top box, a music player, a video player, an entertainment unit, a navigation device, a communication device, a personal digital assistant (PDA), a fixed location data unit, and a computer.

* * * * *